(12) United States Patent
Tanaka

(10) Patent No.: US 9,892,929 B2
(45) Date of Patent: Feb. 13, 2018

(54) SEMICONDUCTOR MANUFACTURING METHOD AND SEMICONDUCTOR DEVICE

(71) Applicant: TOSHIBA MEMORY CORPORATION, Minato-ku (JP)

(72) Inventor: Yumi Tanaka, Ebina (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/266,746

(22) Filed: Sep. 15, 2016

(65) Prior Publication Data

US 2017/0250085 A1 Aug. 31, 2017

Related U.S. Application Data

(60) Provisional application No. 62/301,030, filed on Feb. 29, 2016.

(51) Int. Cl.

| | | |
|---|---|---|
| *H01L 29/792* | (2006.01) | |
| *H01L 21/28* | (2006.01) | |
| *H01L 27/1157* | (2017.01) | |
| *H01L 27/11582* | (2017.01) | |
| *H01L 27/11563* | (2017.01) | |

(Continued)

(52) U.S. Cl.
CPC .... *H01L 21/28282* (2013.01); *H01L 27/1157* (2013.01); *H01L 27/11563* (2013.01); *H01L 27/11565* (2013.01); *H01L 27/11582* (2013.01); *H01L 29/4234* (2013.01);

(Continued)

(58) Field of Classification Search
CPC ........... H01L 29/7926; H01L 29/66833; H01L 29/4234; H01L 29/42344; H01L 27/11563; H01L 27/11582
See application file for complete search history.

(56) References Cited

U.S. PATENT DOCUMENTS

| | | | | |
|---|---|---|---|---|
| 8,513,729 | B2 * | 8/2013 | Choe | ................... G11C 16/0483 257/324 |
| 8,547,747 | B2 * | 10/2013 | Kim | ....................... G11C 5/063 365/185.18 |

(Continued)

FOREIGN PATENT DOCUMENTS

| | | |
|---|---|---|
| JP | 2014-57067 | 3/2014 |
| JP | 2015-79802 | 4/2015 |
| JP | 2015-138834 | 7/2015 |

*Primary Examiner* — Minh-Loan Tran
(74) *Attorney, Agent, or Firm* — Oblon, McClelland, Maier & Neustadt, L.L.P.

(57) ABSTRACT

A semiconductor manufacturing method includes forming a first film on an upper surface of a substrate. The semiconductor manufacturing method includes forming concave portions extending from an upper surface of the first film to below the upper surface of the substrate. The method includes forming a second film from bottom surfaces of the concave portions to a first position in the concave portions between the upper surface of the first film and the upper surface of the substrate. The method includes forming a third film in the concave portions to cover side walls of the concave portions and an upper surface of the second film. The method includes grinding the third film to expose the second film. The method includes removing the second film. The method includes forming a fourth film from the bottom surfaces of the concave portions to at least a lower surface of the third film.

17 Claims, 8 Drawing Sheets

(51) Int. Cl.
*H01L 29/423* (2006.01)
*H01L 29/66* (2006.01)
*H01L 27/11565* (2017.01)

(52) U.S. Cl.
CPC .. *H01L 29/42344* (2013.01); *H01L 29/66833* (2013.01); *H01L 29/7926* (2013.01)

(56) References Cited

U.S. PATENT DOCUMENTS

| | | | |
|---|---|---|---|
| 9,012,974 B2 * | 4/2015 | Chae | H01L 27/11582 257/324 |
| 9,076,879 B2 | 7/2015 | Yoo et al. | |
| 9,196,629 B2 | 11/2015 | Sakuma et al. | |
| 9,659,958 B2 * | 5/2017 | Lee | H01L 27/11582 |
| 9,754,956 B2 * | 9/2017 | Tsutsumi | H01L 27/11582 |
| 9,773,803 B2 * | 9/2017 | Tsuji | H01L 27/11582 |
| 2010/0140684 A1 * | 6/2010 | Ozawa | H01L 21/28282 257/324 |
| 2015/0206897 A1 | 7/2015 | Kuniya | |

* cited by examiner

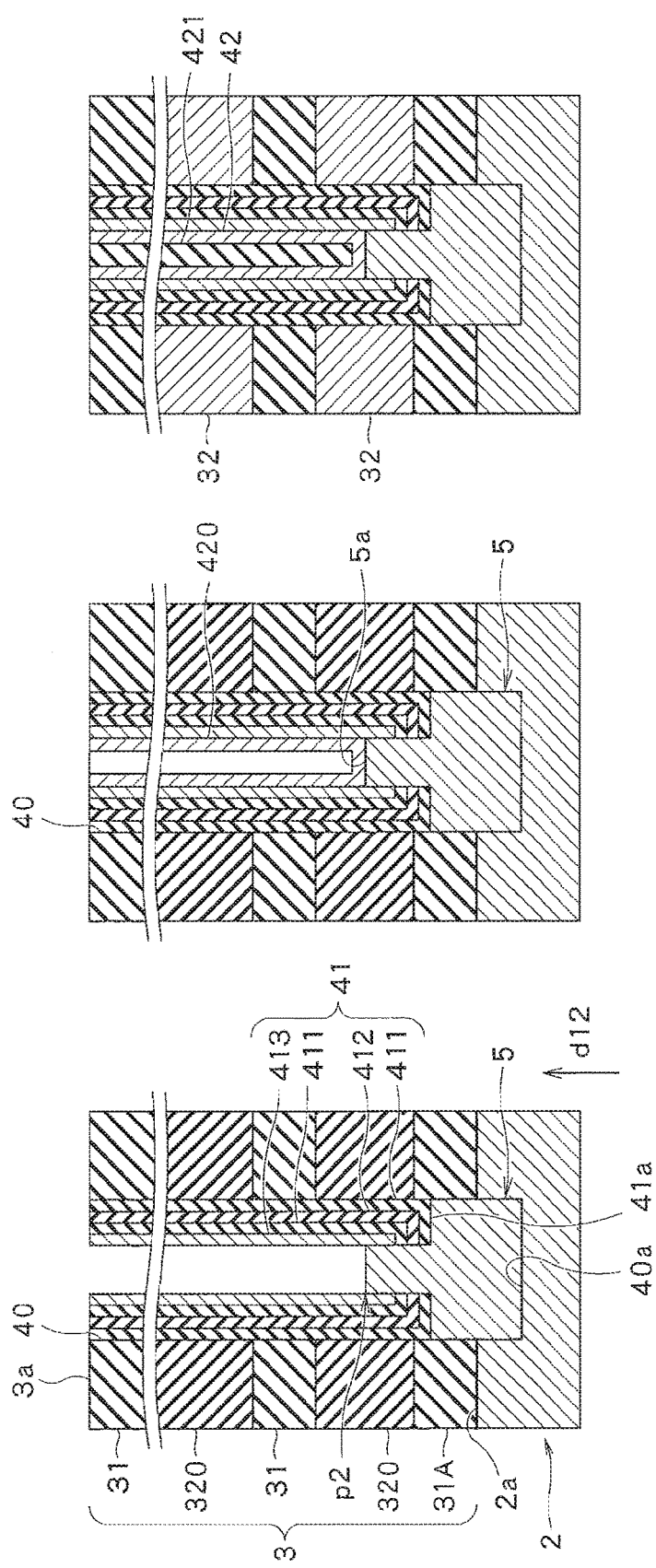

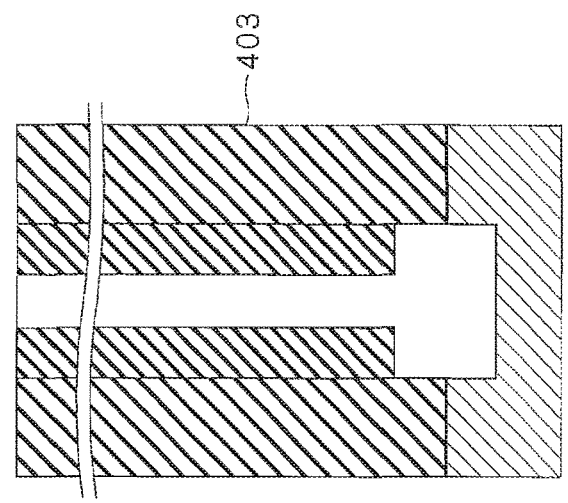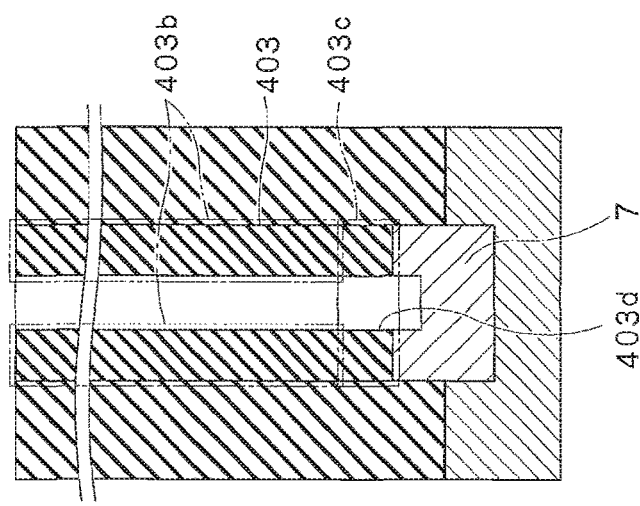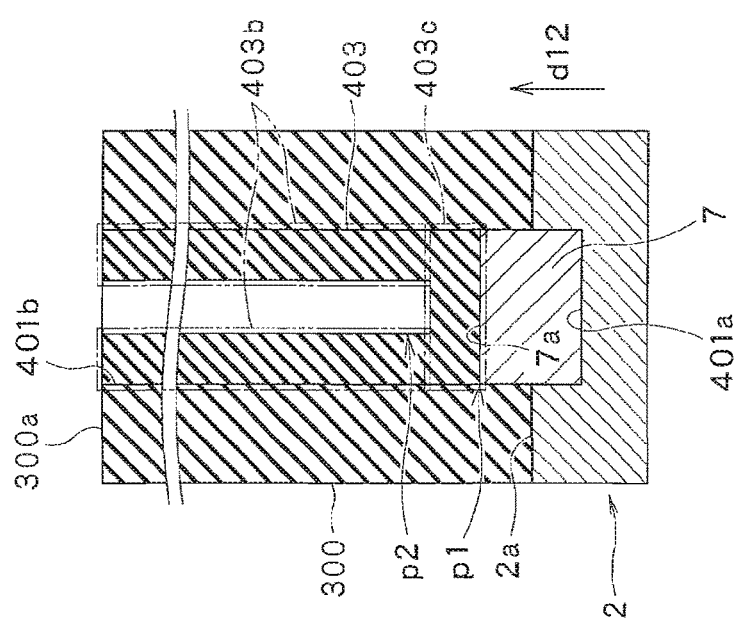

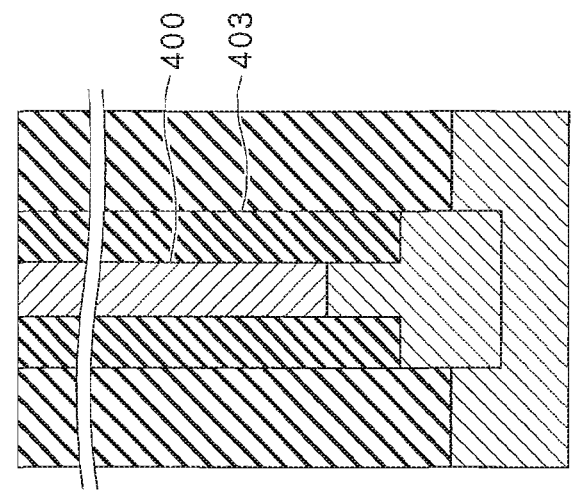
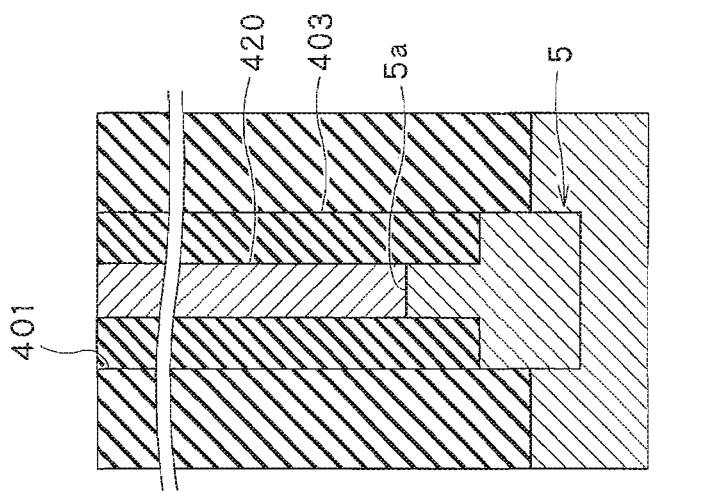
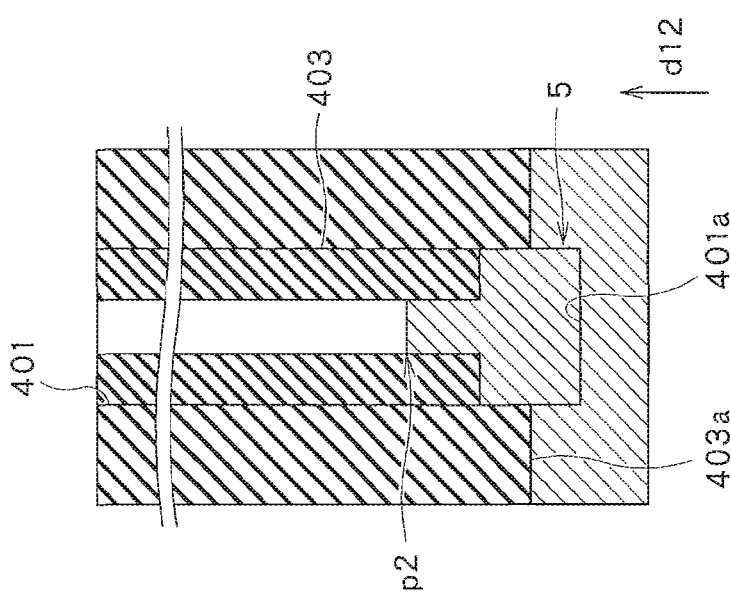

SEMICONDUCTOR MANUFACTURING METHOD AND SEMICONDUCTOR DEVICE

CROSS REFERENCE TO RELATED APPLICATIONS

This application is based upon and claims the benefit of priority from the prior U.S. Provisional Patent Application No. 62/301,030 filed on Feb. 29, 2016, the entire contents of which are incorporated herein by reference.

FIELD

The embodiments of the present invention relate to a semiconductor manufacturing method and a semiconductor device.

BACKGROUND

In a manufacturing process of a three-dimensional stack memory, a wafer is damaged by etching during formation of memory holes by etching. To provide a satisfactory crystallinity of silicon pillars formed in the memory holes, a film (hereinafter, also "epitaxial film") being an underlayer for the silicon pillars is formed by epitaxial growth on the wafer damaged by the etching. Because the epitaxial film has a satisfactory crystallinity, the crystallinity of the silicon pillars formed on the epitaxial film can be improved. After the epitaxial film is formed, a charge accumulation layer is formed on the epitaxial film. A conductive layer is then formed using etching. However, the epitaxial film is conventionally damaged by the etching during formation of the conductive layer. This results in a problem that crystallization of the silicon pillars is inhibited and the property of memory cells is degraded.

BRIEF DESCRIPTION OF THE DRAWINGS

FIG. 4A is a sectional view showing a semiconductor manufacturing method according to the first embodiment following FIG. 3C, FIG. 4B is a sectional view showing a semiconductor manufacturing method following FIG. 4A, and FIG. 4C is a sectional view showing a semiconductor manufacturing method following FIG. 4B;

FIG. 7A is a sectional view showing a semiconductor manufacturing method according to the second embodiment following FIG. 6C, FIG. 7B is a sectional view showing a semiconductor manufacturing method following FIG. 7A, FIG. 7C is a sectional view showing a semiconductor manufacturing method following FIG. 7B; and FIG. 8A is a sectional view showing a semiconductor manufacturing method according to the second embodiment following FIG. 7C, FIG. 8B is a sectional view showing a semiconductor manufacturing method following FIG. 8A, and FIG. 8C is a sectional view showing a semiconductor manufacturing method following FIG. 8B.

DETAILED DESCRIPTION

A semiconductor manufacturing method according to an embodiment includes forming a first film on an upper surface of a substrate. The semiconductor manufacturing method includes forming concave portions extending from an upper surface of the first film to below the upper surface of the substrate. The semiconductor manufacturing method includes forming a second film from bottom surfaces of the concave portions to a first position in the concave portions between the upper surface of the first film and the upper surface of the substrate. The semiconductor manufacturing method includes forming a third film in the concave portions to cover side walls of the concave portions and an upper surface of the second film. The semiconductor manufacturing method includes grinding the third film to expose the second film. The semiconductor manufacturing method includes removing the second film. The semiconductor manufacturing method includes forming a fourth film from the bottom surfaces of the concave portions to at least a lower surface of the third film.

Embodiments will now be explained with reference to the accompanying drawings. The present invention is not limited to the embodiments.

First Embodiment

Figure 1:
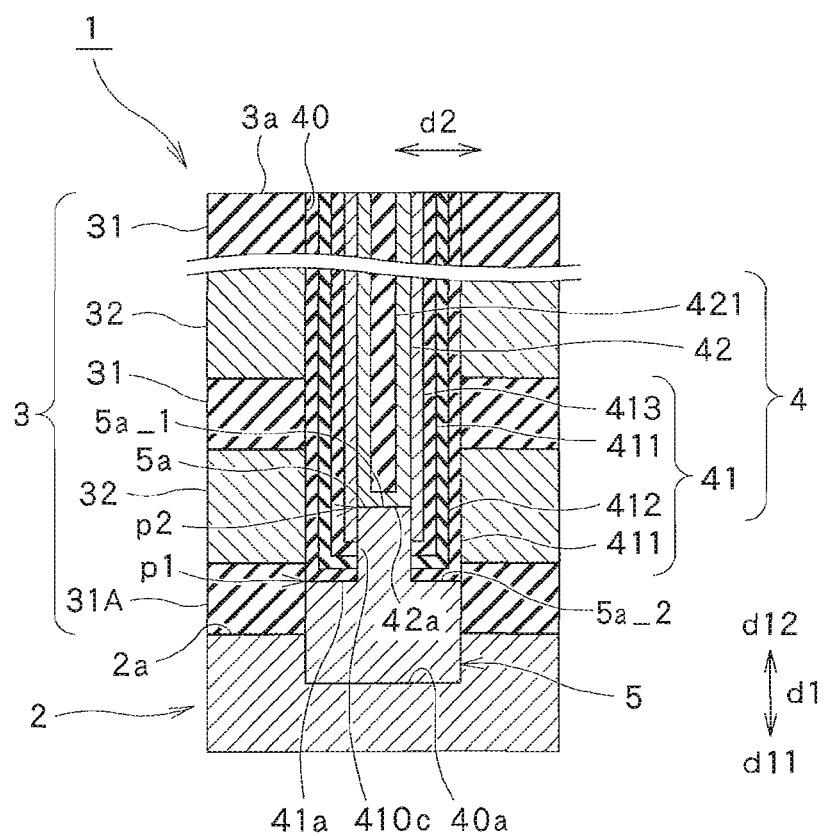
FIG. 1 is a schematic sectional view showing a semiconductor device according to a first embodiment.

FIG. 1 is a schematic sectional view showing a semiconductor device 1 according to a first embodiment. The semiconductor device 1 according to the first embodiment is a mode of a three-dimensional stack memory.

The semiconductor device 1 includes a semiconductor substrate 2 (that is, a contact layer) being an example of a substrate, a stack film 3 being an example of a first film, memory strings 4, and epitaxial films 5 being an example of a fourth film.

(Stack Film 3)

The stack film 3 is placed on an upper surface 2a of the semiconductor substrate 2. The stack film 3 includes insulating layers 31, that is, insulating films and conductive layers 32. The insulating layers 31 and the conductive layers 32 are stacked alternately and repeatedly. The insulating layers 31 are, for example, silicon dioxide films. The conductive layers 32 can include, for example, a tungsten (W) film, a TiN film for growing tungsten, and an AlO film being a block film. The conductive layers 32 are, for example, word lines. The conductive layers 32 can include select gate lines.

(Memory Strings 4)

The memory strings 4 have a substantially columnar shape extending in a stacking direction d1 of the stack film 3, that is, in a vertical direction. The memory strings 4 are embedded in memory holes 40 being an example of concave portions, respectively. The memory holes 40 extend from an upper surface 3a of the stack film 3 to below d11 the upper surface 2a of the semiconductor substrate 2. That is, the memory holes 40 pass through the stack film 3 to reach an inner portion of the semiconductor substrate 2.

Lower surfaces of the memory strings 4 are connected to the epitaxial films 5, that is, source lines. Upper surfaces of the memory strings 4 are connected to bit lines (not shown).

The memory strings 4 each include a charge accumulation layer 41 being an example of a third film, and a silicon pillar 42 (that is, polysilicon) being an example of a fifth film.

The charge accumulation layer 41 has a substantially cylindrical shape extending in the stacking direction d1. The charge accumulation layer 41 covers all around a side wall, that is, an inner circumferential surface of the corresponding memory hole 40. The charge accumulation layer 41 has an ONO structure in which silicon dioxide films 411 and a silicon nitride film 412 are placed alternately in a radial direction d2 of the memory hole 40. The charge accumulation layer 41 has an amorphous silicon layer 413 interposed between the charge accumulation layer 41 and the corresponding silicon pillar 42.

The charge accumulation layers 41 are placed in the memory holes 40, respectively, from the upper surface 3a of the stack film 3 to a first position p1 between the upper surface 3a of the stack film 3 and the upper surface 2a of the semiconductor substrate 2. That is, upper surfaces of the charge accumulation layers 41 are located at a position as high as the upper surface 3a of the stack film 3 and lower surfaces 41a of the charge accumulation layers 41 are located at the first position p1.

The first position p1 is a position corresponding to an insulating layer 31A placed in a lowermost layer (that is, a lower end in the stacking direction d1) of the stack film 3. That is, the position p1 of the lower surfaces 41a of the charge accumulation layers 41 is a position between upper and lower surfaces of the insulating film 31A in the lowermost layer. When the position p1 of the lower surfaces 41a of the charge accumulation layers 41 is thus aligned with the position of the insulating layer 31A in the lowermost layer, the charge accumulation layers 41 can intersect with all the conductive layers 32 in the stack film 3. In this way, all the conductive layers 32 can be provided with storage areas, that is, unit cells being intersections with the charge accumulation layers 41.

The silicon pillar 42 has a substantially cylindrical shape extending in the stacking direction d1. The silicon pillar 42 is located on an inner side of the corresponding charge accumulation layer 41 in the radial direction d2. An insulting layer 421 is placed on an inner side of the silicon pillar 42 in the radial direction d2.

A lower surface 42a of the silicon pillar 42 is in contact with an upper surface 5a of the corresponding epitaxial film 5. More specifically, the silicon pillar 42 is placed in the corresponding memory hole 40 to cover a central portion 5a_1 of the upper surface 5a of the epitaxial film 5. The silicon pillars 42 are obtained by annealing amorphous silicon 420 (see FIG. 4B) placed on the epitaxial films 5 for monocrystallization. Because of the monocrystallization on the epitaxial films 5, the crystallinity of the silicon pillars 42 is influenced by the crystallinity of the epitaxial films 5. As described below, the crystallinity of the epitaxial films 5 in the present embodiment is satisfactory and thus the crystallinity of the silicon pillars 42 is also satisfactory. Because the crystallinity of the silicon pillars 42 is satisfactory, the property (that is, data storage performance) of the memory cells is also satisfactory.

(Epitaxial Films 5)

The epitaxial films 5 are placed from bottom surfaces 40a of the memory holes 40 to at least the lower surfaces 41a of the charge accumulation layers 41, that is, the first position p1, respectively. In the example shown in FIG. 1, the upper surfaces 5a of the epitaxial films 5 reach a second position p2 above d12 the lower surfaces 41a of the charge accumulation layers 41 via through holes 410c formed by processing of bottom portions 410b of cover films 410 described later (see FIGS. 3A and 3B), respectively. In the example shown in FIG. 1, the second position p2 is a position corresponding to the conductive layer 32 being the lowermost one of the conductive layers 32.

More specifically, in the upper surface 5a of the corresponding epitaxial film 5, the central portion 5a_1 on the inner side of the corresponding charge accumulation layer 41 in the radial direction d2 is located above d12 the lower surface 41a of the charge accumulation layer 41. A peripheral portion 5a_2 on an outer side of the central portion 5a_1 in the radial direction d2 in the upper surface 5a of the epitaxial film 5 is in contact with the lower surface 41a of the charge accumulation layer 41. The central portion 5a_1 can be placed at a position as high as the lower surface 41a of the charge accumulation layer 41.

The epitaxial films 5 are, for example, films of a silicon single crystal, that is, semiconductor films. The epitaxial films 5 bring the semiconductor substrate 2 and the memory strings 4 to conduction. The epitaxial films 5 can be referred to as "contact layers". Alternatively, the epitaxial films 5 can be conductor films.

Because the epitaxial films 5 are formed by a semiconductor manufacturing method describe later, concave portions due to reactive ion etching are not formed in the epitaxial films 5. Because the concave portions are not formed therein, the epitaxial films 5 are not damaged by the reactive ion etching. The epitaxial films 5 are not damaged and thus have a satisfactory crystallinity. Because the epitaxial films 5 have a satisfactory crystallinity, the silicon pillars 42 on the epitaxial films 5 also have a satisfactory crystallinity.

Therefore, with the semiconductor device 1 according to the first embodiment, the crystallinity of the silicon pillars 42 can be improved and thus the device property, that is, the memory cell property can be improved.

(Semiconductor Manufacturing Method)

A manufacturing method for manufacturing the semiconductor device 1 shown in FIG. 1 is explained next.

Figure 2A:
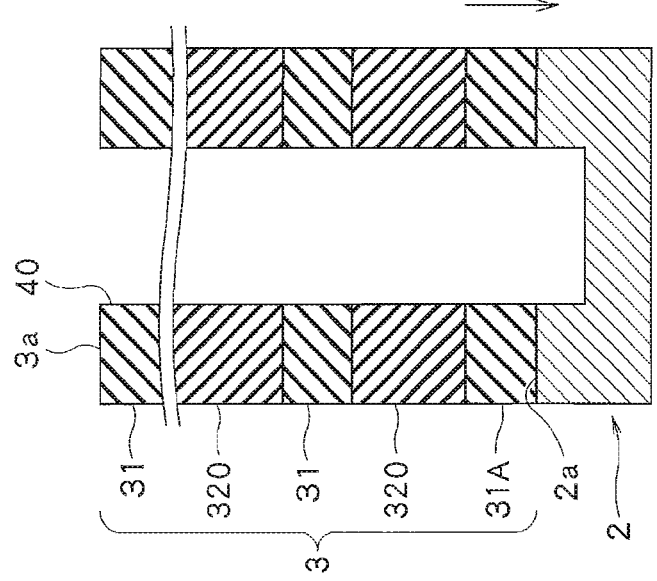
FIG. 2A is a sectional view showing a semiconductor manufacturing method according to the first embodiment.

FIG. 2A is a sectional view showing a semiconductor manufacturing method according to the first embodiment. First, the stack film 3 is formed by alternately stacking the insulating layers 31 and silicon nitride films 320 on the semiconductor substrate 2 as shown in FIG. 2A. The insulating layers 31 and the silicon nitride films 320 can be formed, for example, by a CVD (Chemical Vacuum Deposition) method. After the stack film 3 is formed, the memory holes 40 extending through the stack film 3 are formed from the upper surface 3a of the stack film 3 to below d11 the upper surface 2a of the semiconductor substrate 2 as shown in FIG. 2A. The memory holes 40 can be formed, for example, by reactive ion etching.

Figure 2B:
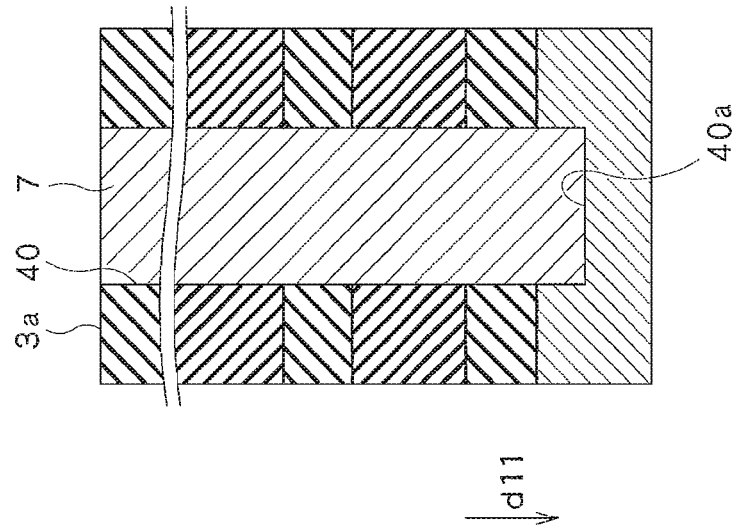
FIG. 2B is a sectional view showing a semiconductor manufacturing method following FIG. 2A.

FIG. 2B is a sectional view showing a semiconductor manufacturing method following FIG. 2A. After the memory holes 40 are formed, carbon films 7 being an example of a second film are formed from the bottom surfaces 40a of the memory holes 40 to the upper surface 3a of the stack film 3, respectively, as shown in FIG. 2B. That is, the carbon films 7 are embedded in the memory holes 40, respectively. The carbon films 7 are films of amorphous carbon. As described later, the carbon films 7 are removed from the semiconductor substrate 2 in the course of the manufacturing process of the semiconductor device 1. Accordingly, the carbon films 7 can be referred to as "sacrifice films". The carbon films 7 can be formed to above the upper surface 3a of the stack film 3.

A heatproof temperature of the carbon films 7 is higher than a process temperature of the cover films 410 described later. The heatproof temperature of the carbon films 7 can be, for example, 550° C. or a higher temperature. The carbon films 7 can be formed, for example, by the CVD method using rare gas and propylene.

Figure 2C:
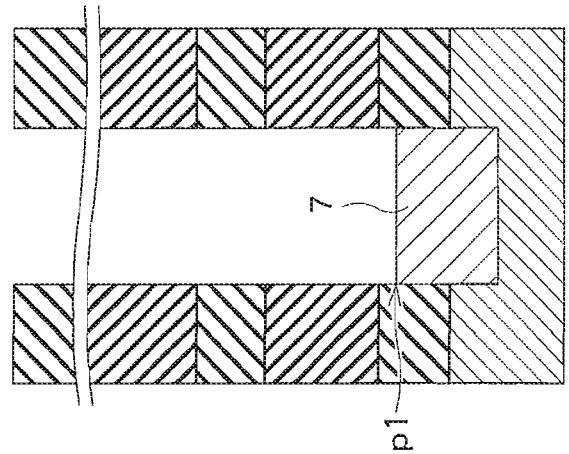
FIG. 2C is a sectional view showing a semiconductor manufacturing method following FIG. 2B.

FIG. 2C is a sectional view showing a semiconductor manufacturing method following FIG. 2B. After the carbon films 7 are formed, the carbon films 7 are ground to the first position p1 as shown in FIG. 2C. The carbon films 7 can be, for example, etched back, that is, ground by etching.

Figure 3A:
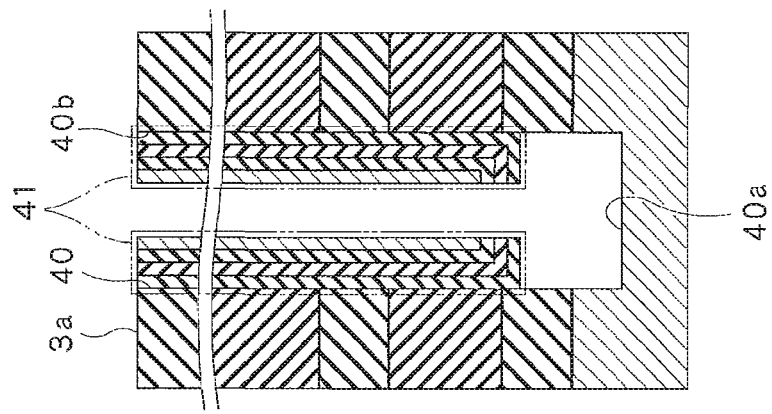
FIG. 3A is a sectional view showing a semiconductor manufacturing method according to the first embodiment following FIG. 2C.

FIG. 3A is a sectional view showing a semiconductor manufacturing method according to the first embodiment following FIG. 2C. After the carbon films 7 are ground, the cover films 410 being an example of the third film are formed in the memory holes 40 to cover side walls 40b of the memory holes 40 and upper surfaces 7a of the carbon films 7, respectively, as shown in FIG. 3A.

The cover films 410 each correspond to a configuration in which the charge accumulation layer 41 is closed at an opening on a lower end by a same stack film as the charge accumulation layer 41. In other words, the cover films 410 each have a side portion 410a that covers the side wall 40b of the corresponding memory hole 40, and the bottom portion 410b that covers the upper surface 7a of the corresponding carbon film 7. The cover films 410 can be formed, for example, by stacking a silicon dioxide film 411, a silicon nitride film 412, a silicon dioxide film 411, and an amorphous silicon layer 413 in this order by the CVD method.

The cover films 410 are formed at a temperature lower than the heatproof temperature of the carbon films 7. Due to the higher heatproof temperature of the carbon films 7 than the process temperature of the cover films 410, the carbon films 7 are not lost by heat during formation of the cover films 410. Because the carbon films 7 being underlayers can withstand the process temperature of the cover films 410, the cover films 410 can be formed in appropriate shape and size on the carbon films 7, respectively.

Figure 3B:
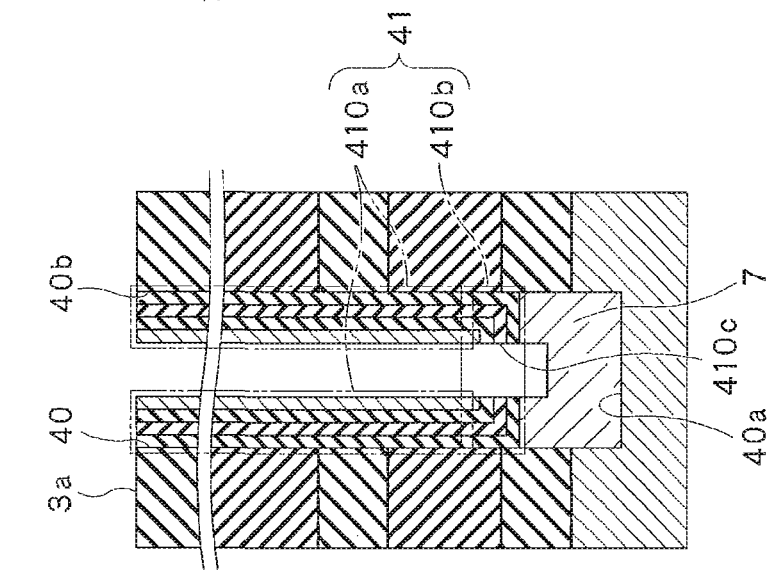
FIG. 3B is a sectional view showing a semiconductor manufacturing method following FIG. 3A.

FIG. 3B is a sectional view showing a semiconductor manufacturing method following FIG. 3A. After the cover films 410 are formed, the cover films 410 are ground to expose the carbon films 7 in the memory holes 40, respectively, as shown in FIG. 3B. That is, the through holes 410c passing through the bottom portions 410b of the cover films 410 are formed at central parts of the bottom portions 410b. The grinding of the cover films 410 forms the charge accumulation layers 41. Furthermore, due to exposure of the carbon films 7, the carbon films 7 can be exposed to an atmosphere for ashing to remove the carbon films 7. During the grinding of the cover films 410, the carbon films 7 can also be ground to some extent. The cover films 410 can be ground, for example, by reactive ion etching. The cover films 410 can be ground by etching using gas including fluorine and oxygen.

Figure 3C:
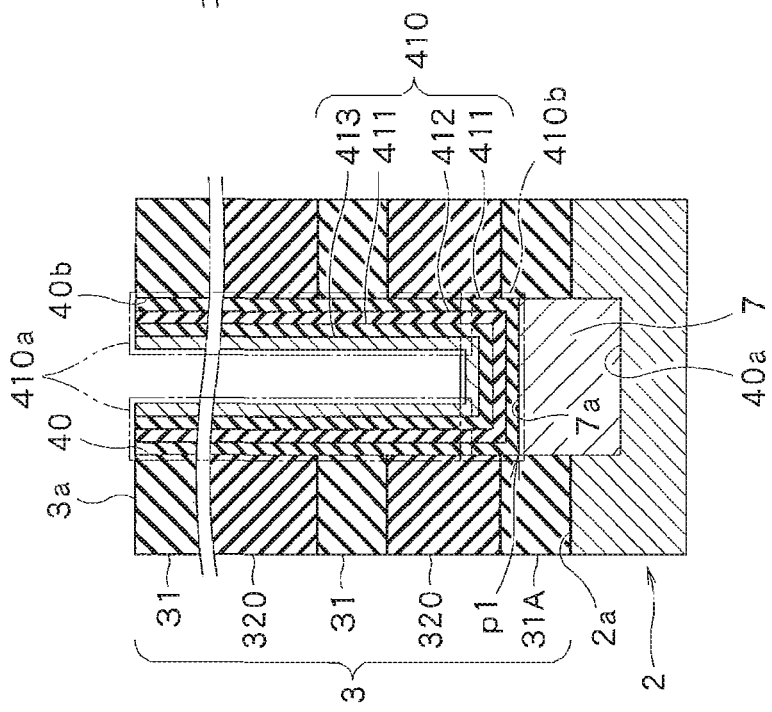
FIG. 3C is a sectional view showing a semiconductor manufacturing method following FIG. 3B.

FIG. 3C is a sectional view showing a semiconductor manufacturing method following FIG. 3B. After the cover films 410 are ground, the carbon films 7 are removed as shown in FIG. 3C. The carbon films 7 can be removed, for example, by ashing. When plasma ashing is performed, oxygen gas having been turned into plasma is supplied to the carbon films 7 exposed through the cover films 410 to convert the carbon films 7 into carbon dioxide and water vapor by a reaction with the oxygen gas. In this way, the carbon films 7 can be removed.

FIG. 4A is a sectional view showing a semiconductor manufacturing method according to the first embodiment following FIG. 3C. After the carbon films 7 are removed, the epitaxial films 5 are epitaxially grown from the bottom surfaces 40a of the memory holes 40 to the second position p2 above d12 the lower surfaces 41a of the charge accumulation layers 41, respectively, as shown in FIG. 4A.

The epitaxial films 5 are formed in regions in which the charge accumulation layers 41 are not formed in the memory holes 40 having substantially-uniform inner diameters, respectively. Meanwhile, the silicon pillars 42 are formed on the epitaxial films 5 on the inner side of the charge accumulation layers 41 in the memory holes 40, respectively. Therefore, the outermost diameter of the epitaxial films 5 is larger than the outer diameter of the silicon pillars 42. If the upper surfaces 5a of the epitaxial films 5 are located below d11 the lower surfaces 41a of the charge accumulation layers 41, lower end portions of the silicon pillars 42 are formed in voids in which the side walls of the charge accumulation layers 41 are not provided. In this case, control on the outer diameter of the silicon pillars 42 at the lower end portions becomes difficult and it is difficult to obtain a stable memory cell property. In contrast thereto, in the present embodiment, because the upper surfaces 5a of the epitaxial films 5 can be located above d12 the lower surfaces 41a of the charge accumulation layers 41, the outer diameter of the silicon pillars 42 can be appropriately controlled by the inner diameter of the charge accumulation layers 41.

FIG. 4B is a sectional view showing a semiconductor manufacturing method following FIG. 4A. After the epitaxial films 5 are formed, amorphous silicon 420 is formed in the memory holes 40 to be in contact with the upper surfaces 5a of the epitaxial films 5 as shown in FIG. 4B. The amorphous silicon 420 can be formed, for example, by the CVD method.

FIG. 4C is a sectional view showing a semiconductor manufacturing method following FIG. 4B. After the amorphous silicon 420 is formed, the amorphous silicon 420 is monocrystallized to form the silicon pillars 42 as shown in FIG. 4C. The amorphous silicon 420 can be monocrystallized, for example, by annealing. After the silicon pillars 42 are formed, the insulating layers 421 are embedded in inner portions of the silicon pillars 42, respectively.

Furthermore, as shown in FIG. 4C, the silicon nitride films 320 are replaced with the conductive layers 32, respectively. Replacement with the conductive layers 32 can be achieved, for example, by removing the silicon nitride films 320 by wet etching using a heated phosphoric acid solution and then forming the conductive layers 32 by the CVD method in voids formed by the removal of the silicon nitride films 320.

If the epitaxial films 5 are formed before the charge accumulation layers 41 are formed, the charge accumulation layers 41 are formed using the epitaxial films 5 as underlayers. In this case, when the cover films 410 are ground to form the charge accumulation layers 41, the epitaxial films 5 under the cover films 410 are also ground. Due to being ground, the epitaxial films 5 are damaged and the crystallinity is disturbed. The disturbed crystallinity of the epitaxial films 5 inhibits crystallization of the amorphous silicon 420 formed on the epitaxial films 5. Due to the inhibition of the crystallization of the amorphous silicon 420, the crystallinity of the silicon pillars 42 based on the amorphous silicon 420 is degraded. Accordingly, the memory cell property is degraded.

In contrast thereto, in the first embodiment, after the charge accumulation layers 41 are formed using the carbon films 7 instead of the epitaxial films 5 as the underlayers, the carbon films 7 are replaced with the epitaxial films 5, respectively. Because the carbon films 7 are removed, the device property is not affected even when the carbon films 7 are ground together with the cover films 410 during formation of the charge accumulation layers 41. Furthermore, because the charge accumulation layers 41 are already formed at the time of formation of the epitaxial films 5, the epitaxial films 5 are not damaged by formation of the charge accumulation layers 41 and the crystallinity is not disturbed.

Therefore, according to the first embodiment, damages of the epitaxial films 5 can be avoided. This can improve the crystallinity of the silicon pillars 42 and can improve the memory cell property.

Second Embodiment

Figure 5:
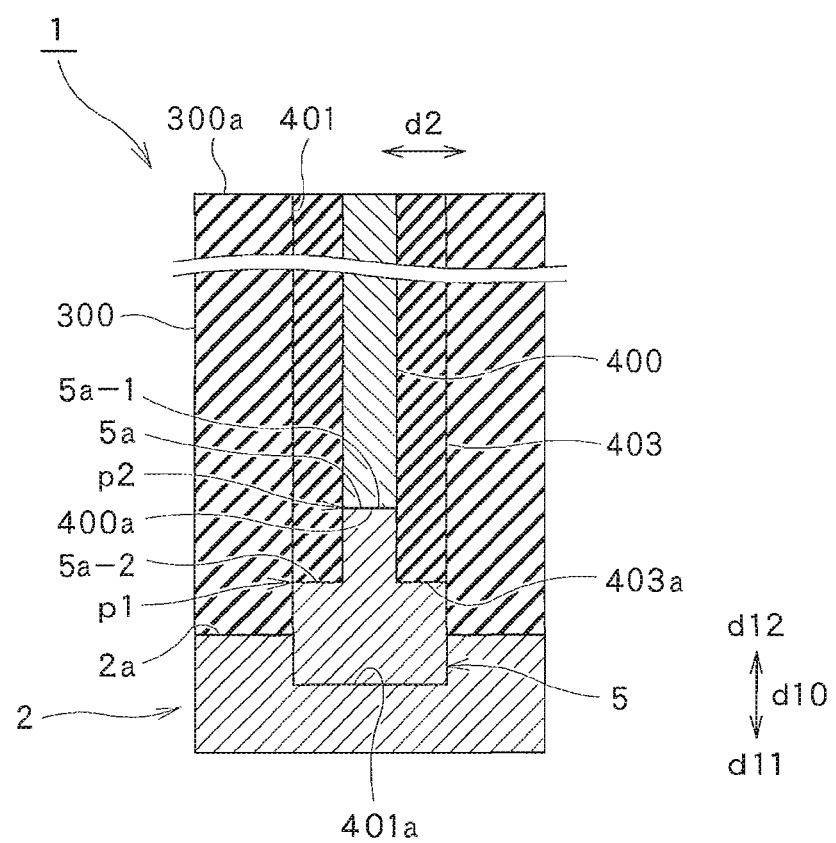
FIG. 5 is a schematic sectional view showing a semiconductor device according to a second embodiment.

The semiconductor device 1 having contacts on the epitaxial films 5, respectively, is explained next as a second embodiment. In the second embodiment, constituent parts corresponding to those in the first embodiment are denoted by like reference characters and explanations thereof will be omitted. FIG. 5 is a schematic sectional view showing the semiconductor device 1 according to the second embodiment.

As shown in FIG. 5, the semiconductor device 1 according to the second embodiment includes the semiconductor substrate 2, an insulating film 300 being an example of the first film, spacer films 403 being an example of the third film, contacts 400 (that is, wiring parts) being an example of the fifth film, and the epitaxial films 5. The semiconductor device 1 also includes contact holes 401 being an example of the concave portions.

The insulating film 300 is placed on the upper surface 2a of the semiconductor substrate 2. The insulating film 300 can be, for example, a silicon dioxide film.

The contact holes 401 extend in a thickness direction d10 of the insulating film 300, that is, in a vertical direction. Specifically, the contact holes 401 are located from an upper surface 300a of the insulating film 300 to below d11 the upper surface 2a of the semiconductor substrate 2. That is, the contact holes 401 pass through the insulating film 300 to reach an inner portion of the semiconductor substrate 2.

The spacer films 403 are placed in the contact holes 401, for example, for the purpose of causing the outer diameter of the contacts 400 to be smaller than the inner diameter of the contact holes 401 by a desired size, respectively. The spacer films 403 can be, for example, an insulating film such as a silicon dioxide film.

The spacer films 403 have a substantially cylindrical shape extending in the thickness direction d10 of the insulating film 300.

The spacer films 403 are placed in the contact holes 401 from the upper surface 300a of the insulating film 300 to the first position p1 between the upper surface 300a of the insulating film 300 and the upper surface 2a of the semiconductor substrate 2.

The spacer films 403 are formed in the substantially cylindrical shape to cover all around side walls of the contacts 400, respectively.

The contacts 40 have a substantially columnar shape extending in the thickness direction d10 of the insulating film 300. The contacts 400 are embedded in the contact holes 401 with the spacer films 403 interposed therebetween, respectively.

Lower surfaces 400a of the contacts 400 are in contact with the upper surfaces 5a of the epitaxial films 5, respectively. More specifically, the contacts 400 are placed in the contact holes 401 to cover the central portions 5a_1 of the upper surfaces 5a of the epitaxial films 5, respectively. Upper surfaces of the contacts 400 are connected to upper lines (not shown).

The contacts 400 are obtained by annealing the amorphous silicon 420 (see FIG. 8B) placed on the epitaxial films 5 for monocrystallization.

The epitaxial films 5 are placed from bottom surfaces 401a of the contact holes 401 to at least lower surfaces 403a of the spacer films 403, that is, to the first position p1. In the example shown in FIG. 5, the upper surfaces 5a of the epitaxial films 5 reach the second position p2 above d12 the lower surfaces 403a of the spacer films 403 via through holes 403d formed by processing of bottom portions 403c of the spacer films 403 described later (see FIGS. 7A and 7B).

More specifically, the central portions 5a_1 on an inner side of the spacer films 403 in the radial direction d2 in the upper surfaces 5a of the epitaxial films 5 are placed above d12 the lower surfaces 403a of the spacer films 403. The peripheral portions 5a_2 in the upper surfaces 5a of the epitaxial films 5 are in contact with the lower surfaces 403a of the spacer films 403. The central portions 5a_1 can be placed at a position as high as the lower surfaces 403a of the spacer films 403.

Similarly to the first embodiment, concave portions due to reactive ion etching are not formed in the epitaxial films 5. Because no concave portions are formed, the epitaxial films 5 are not damaged by the reactive ion etching and have a satisfactory crystallinity. Due to a satisfactory crystallinity of the epitaxial films 5, the contacts 400 on the epitaxial films 5 also have a satisfactory crystallinity.

Therefore, with the semiconductor device 1 according to the second embodiment, the crystallinity of the contacts 400 can be improved and thus the device property can be improved.

A manufacturing method for manufacturing the semiconductor device 1 shown in FIG. 5 is explained next.

Figure 6C:
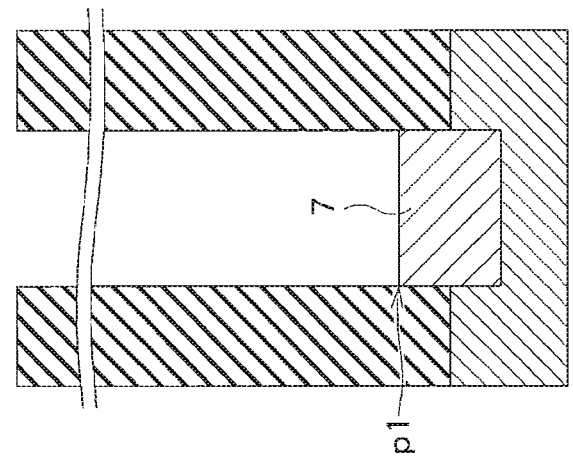
FIG. 6C is a sectional view showing a semiconductor manufacturing method following FIG. 6B.
Figure 6B:
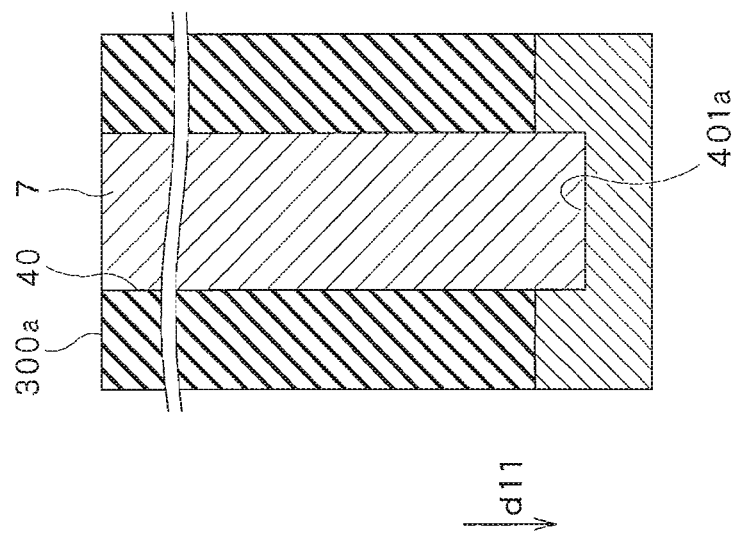
FIG. 6B is a sectional view showing a semiconductor manufacturing method following FIG. 6A.
Figure 6A:
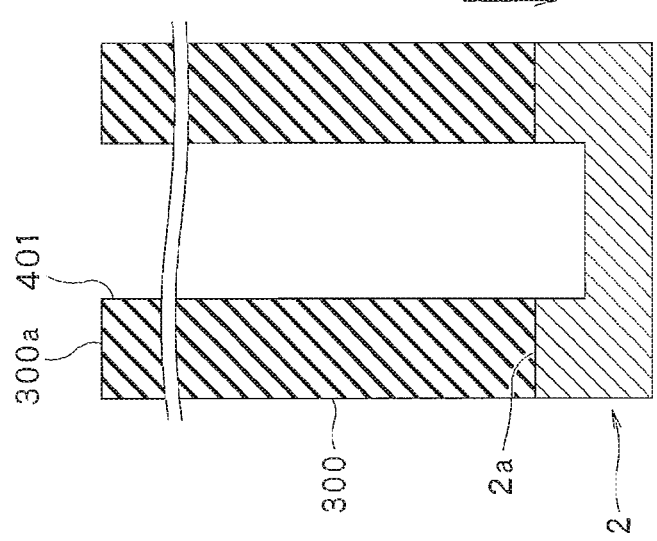
FIG. 6A is a sectional view showing a semiconductor manufacturing method according to the second embodiment.

FIG. 6A is a sectional view showing a semiconductor manufacturing method according to the second embodiment. First, the insulating film 300 is formed on the semiconductor substrate 2 as shown in FIG. 6A. The insulating film 300 can be formed, for example, by the CVD method. After the insulating film 300 is formed, the contact holes 401 extending through the insulting film 300 are formed from the upper surface 300a of the insulating film 300 to below d11 the upper surface 2a of the semiconductor substrate 2 as shown in FIG. 6A. The contact holes 401 can be formed, for example, by reactive ion etching.

FIG. 6B is a sectional view showing a semiconductor manufacturing method following FIG. 6A. After the contact holes 401 are formed, the carbon films 7 are formed from the bottom surfaces 401a of the contact holes 401 to the upper surface 300a of the insulating film 300, respectively, as shown in FIG. 6B.

FIG. 6C is a sectional view showing a semiconductor manufacturing method following FIG. 6B. After the carbon films 7 are formed, the carbon films 7 are ground to the first position p1 as shown in FIG. 6C.

FIG. 7A is a sectional view showing a semiconductor manufacturing method according to the second embodiment following FIG. 6C. After the carbon films 7 are ground, the spacer films 403 being an example of the third film are formed in the contact holes 401 to cover side walls 401b of the contact holes 401 and the upper surfaces 7a of the carbon films 7, respectively, as shown in FIG. 7A. The spacer films 403 each have a side portion 403b covering the side wall 401b of the corresponding contact hole 401 and a bottom portion 403c covering the upper surface 7a of the corresponding carbon film 7. The spacer films 403 are formed, for example, by the CVD method at a temperature lower than the heatproof temperature of the carbon films 7. Due to the higher heatproof temperature of the carbon films 7 than the process temperature of the spacer films 403, the carbon films 7 are not lost during formation of the spacer films 403. Because the carbon films 7 as the underlayers can withstand the process temperature of the spacer films 403, the spacer films 403 can be formed in appropriate shape and size on the carbon films 7, respectively.

FIG. 7B is a sectional view showing a semiconductor manufacturing method following FIG. 7A. After the spacer films 403 are formed, the spacer films 403 are ground to expose the carbon films 7 in the corresponding contact holes 401, respectively, as shown in FIG. 7B. That is, central parts of the bottom portions 403c of the spacer films 403 are removed. When the spacer films 403 are ground, the carbon films 7 can also be ground. The spacer films 403 can be ground, for example, by reactive ion etching.

FIG. 7C is a sectional view showing a semiconductor manufacturing method following FIG. 7B. After the spacer films 403 are ground, the carbon films 7 are removed as shown in FIG. 7C. The carbon films 7 can be removed, for example, by ashing.

FIG. 8A is a sectional view showing a semiconductor manufacturing method according to the second embodiment following FIG. 7C. After the carbon films 7 are removed, the epitaxial films 5 are epitaxially grown from the bottom surfaces 401a of the contact holes 401 to the second position p2 above d12 the lower surfaces 403a of the spacer films 403, respectively, as shown in FIG. 8A.

FIG. 8B is a sectional view showing a semiconductor manufacturing method following FIG. 8A. After the epitaxial films 5 are formed, the amorphous silicon 420 (the fifth film) is formed in the contact holes 401 to be in contact with the upper surfaces 5a of the epitaxial films 5 as shown in FIG. 8B. The amorphous silicon 420 can be formed, for example, by the CVD method.

FIG. 8C is a sectional view showing a semiconductor manufacturing method following FIG. 8B. After the amorphous silicon 420 is formed, the amorphous silicon 420 is monocrystallized to form the contacts 400 as shown in FIG. 8C. The amorphous silicon 420 can be monocrystallized, for example, by annealing.

If the epitaxial films 5 are formed before the spacer films 403 are formed, the spacer films 403 are formed using the epitaxial films 5 as the underlayers. In this case, at the time of grinding of the spacer films 403, the epitaxial films 5 under the spacer films 403 are also ground. Due to being ground, the epitaxial films 5 are damaged and the crystallinity is disturbed. The disturbed crystallinity of the epitaxial films 5 inhibits crystallization of the amorphous silicon 420 formed on the epitaxial films 5. Due to inhibition of the crystallization of the amorphous silicon 420, the crystallinity of the contacts 40 based on the amorphous silicon 420 is degraded. Accordingly, the device property is degraded.

In contrast thereto, in the second embodiment, after the spacer films 403 are formed using the carbon films 7 instead of the epitaxial films 5 as the underlayers, the carbon films 7 are replaced with the epitaxial films 5, respectively.

Because the carbon films 7 are removed, the device property is not affected even when the carbon films 7 are ground together with the spacer films 403 during grinding of the spacer films 403. Furthermore, because the spacer films 403 are already ground when the epitaxial films 5 are formed, the epitaxial films 5 are not damaged by processing of the spacer films 403 and the crystallinity is not disturbed.

Therefore, also in the second embodiment, damages of the epitaxial films 5 can be avoided. This can improve the crystallinity of the contacts 400 and improve the device property.

The conductive layers 32 described in the first embodiment extend in a word line direction (the direction d2 in FIG. 1, for example) to outside a cell region. Ends of the conductive layers 32 in the extension direction are closer to the cell region as the conductive layers 32 are located in upper layers. Therefore, in the outside the cell region, the conductive layers 32 form a stepped shape as a whole. The present embodiment can also be applied to connect the conductive layers 32 in the stepped shape to upper lines with contacts. In this case, the present embodiment can be applied regarding the conductive layers 32 as substrates.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing method comprising:
    forming a first film on an upper surface of a substrate;
    forming concave portions extending from an upper surface of the first film to below the upper surface of the substrate;
    forming a second film from bottom surfaces of the concave portions to a first position in the concave portions between the upper surface of the first film and the upper surface of the substrate;
    forming a third film in the concave portions to cover side walls of the concave portions and an upper surface of the second film,
    grinding the third film to expose the second film;
    removing the second film; and
    forming a fourth film from the bottom surfaces of the concave portions to at least a lower surface of the third film.

2. The method of claim 1, comprising forming a fifth film in the concave portions to cover side walls of the third film and an upper surface of the fourth film.

3. The method of claim 2, wherein
    forming of the second film comprises:
    forming the second film from the bottom surfaces of the concave portions to at least the upper surface of the first film, and
    grinding the second film to the first position.

4. The method of claim 2, wherein the first film is a stack film having insulating films and silicon nitride films stacked alternately.

5. The method of claim 4, wherein the first position is a position corresponding to an insulating film placed at a lower end in a stacking direction of the stack film.

6. The method of claim 4, wherein the third film is a stack film including oxide films and nitride films.

7. The method of claim 4, comprising replacing the silicon nitride films with conductive layers, respectively.

8. The method of claim 1, wherein
forming of the second film comprises:
   forming the second film from the bottom surfaces of the concave portions to at least the upper surface of the first film, and
   grinding the second film to the first position.

9. The method of claim 1, wherein the second film has a heatproof temperature higher than a process temperature of formation of the third film.

10. The method of claim 9, wherein the second film includes carbon.

11. The method of claim 1, wherein the fourth film is formed by epitaxial growth.

12. The method of claim 1, wherein the fourth film includes a semiconductor or a conductor.

13. The method of claim 1, wherein the third film is ground by etching using gas including fluorine and oxygen.

14. The method of claim 1, wherein the first film is a stack film having insulating films and silicon nitride films stacked alternately.

15. The method of claim 14, wherein the first position is a position corresponding to an insulating film placed at a lower end in a stacking direction of the stack film.

16. The method of claim 14, wherein the third film is a stack film including oxide films and nitride films.

17. The method of claim 14, comprising replacing the silicon nitride films with conductive layers, respectively.

* * * * *